(12) United States Patent
Kihara

(10) Patent No.: US 8,587,390 B2
(45) Date of Patent: Nov. 19, 2013

(54) MEMS VIBRATOR, OSCILLATOR, AND METHOD FOR MANUFACTURING MEMS VIBRATOR

(75) Inventor: Ryuji Kihara, Matsumoto (JP)

(73) Assignee: Seiko Epson Corporation (JP)

( * ) Notice: Subject to any disclaimer, the term of this patent is extended or adjusted under 35 U.S.C. 154(b) by 169 days.

(21) Appl. No.: 13/307,336

(22) Filed: Nov. 30, 2011

(65) Prior Publication Data

US 2012/0146736 A1 Jun. 14, 2012

(30) Foreign Application Priority Data

Dec. 13, 2010 (JP) ................................ 2010-276923

(51) Int. Cl.
*H03H 9/24* (2006.01)
*H01L 21/00* (2006.01)

(52) U.S. Cl.
USPC .............................. 333/186; 333/200; 438/52

(58) Field of Classification Search
USPC ........... 333/186, 197, 200; 310/309; 257/415; 438/50, 52
See application file for complete search history.

(56) References Cited

U.S. PATENT DOCUMENTS

| 6,433,657 | B1 * | 8/2002 | Chen | .............................. | 333/262 |
| 6,784,769 | B1 * | 8/2004 | Chen | ............................. | 333/262 |
| 7,705,693 | B2 | 4/2010 | Davis | | |
| 8,026,120 | B2 | 9/2011 | Kihara et al. | | |
| 2003/0062961 | A1 * | 4/2003 | Ma et al. | ........................ | 331/100 |
| 2005/0007219 | A1 * | 1/2005 | Ma et al. | .......................... | 335/78 |
| 2009/0229648 | A1 * | 9/2009 | Makansi | ........................ | 136/201 |
| 2010/0090786 | A1 * | 4/2010 | Inaba et al. | ................... | 333/219 |
| 2010/0176898 | A1 * | 7/2010 | Kihara | ........................... | 333/186 |
| 2011/0050366 | A1 * | 3/2011 | Ayazi et al. | .................... | 333/187 |
| 2011/0309891 | A1 * | 12/2011 | van der Avoort | ............. | 331/156 |
| 2012/0249253 | A1 * | 10/2012 | Kihara | .......................... | 331/154 |
| 2012/0270352 | A1 * | 10/2012 | Huffman et al. | ................ | 438/50 |
| 2013/0168782 | A1 * | 7/2013 | Jahnes et al. | ................... | 257/415 |

FOREIGN PATENT DOCUMENTS

JP 2010-162629 7/2010

OTHER PUBLICATIONS

B. Morgan et al.; "Vertically-Shaped Tunable MEMS Resonators"; Journal of Microelectromechanical Systems, vol. 17, No. 1, Feb. 2008, pp. 85-92.*

* cited by examiner

*Primary Examiner* — Barbara Summons
(74) *Attorney, Agent, or Firm* — Harness, Dickey & Pierce, P.L.C.

(57) ABSTRACT

A MEMS resonator according to the invention includes: a substrate; a first electrode formed above the substrate; and a second electrode having a supporting portion which is formed above the substrate and a beam portion which is supported by the supporting portion and arranged above the first electrode, wherein the beam portion has, in plan view, a shape in which the width monotonically decreases in a direction from the supporting portion toward a tip of the beam portion in a region overlapping the first electrode.

8 Claims, 6 Drawing Sheets

MEMS VIBRATOR, OSCILLATOR, AND METHOD FOR MANUFACTURING MEMS VIBRATOR

BACKGROUND

1. Technical Field

The present invention relates to a MEMS resonator, an oscillator, and a method for manufacturing the MEMS resonator.

2. Related Art

MEMS (micro electro mechanical systems), which are one of techniques for forming a minute structure, mean a technique for making, for example, a micro electro mechanical system in micron order, or the product thereof.

JP-A-2010-162629 discloses a MEMS resonator having a fixed electrode and a movable electrode, in which the movable electrode is driven with an electrostatic force generated between both the electrodes.

However, since the MEMS resonator has a micro structure, variations in manufacturing process greatly affect operating characteristics. For example, the MEMS resonator resonates at a predetermined frequency by the driving of the movable electrode, and the shape (length) of the movable electrode varies according to the variations in manufacturing process, whereby the MEMS resonator sometimes fails to provide stable resonation characteristics (for example, frequency accuracy).

SUMMARY

An advantage of some aspects of the invention is to provide a MEMS resonator having stable resonation characteristics and a method for manufacturing the MEMS resonator. Another advantage of some aspects of the invention is to provide an oscillator having the MEMS resonator.

A MEMS resonator according to an aspect of the invention includes: a substrate; a first electrode formed above the substrate; and a second electrode having a supporting portion which is formed above the substrate and a beam portion which is supported by the supporting portion and arranged above the first electrode, wherein the beam portion has, in plan view, a shape in which the width monotonically decreases in a direction from the supporting portion toward a tip of the beam portion in a region overlapping the first electrode.

According to the MEMS resonator, even when the length of the beam portion varies according to variations in manufacturing process (more specifically, in patterning the second electrode), variations in the frequency of the beam portion can be reduced (the details will be described later) compared to, for example, a beam portion having a rectangular planar shape. That is, it is possible to reduce the amount of change in frequency for the amount of change in the length of the beam portion. As a result, the MEMS resonator can have stable resonation characteristics.

It is noted that, in the descriptions concerning the invention, the term 'above' may be used, for example, in a manner as "a specific element (hereinafter referred to as 'A') is formed 'above' another specific element (hereinafter referred to as 'B')". In the case of such an example, the term 'above' is used, while assuming that it includes the case where A is formed directly on B, and the case where A is formed above B through another element.

The MEMS resonator according to the aspect of the invention may be configured such that the beam portion has a shape in which the width progressively changes from the supporting portion toward the tip of the beam portion.

According to this MEMS resonator, it is possible to eliminate a section where the width remains the same on the way from the supporting portion to the tip, and the width can be continuously changed from the supporting portion to the tip. Therefore, it is possible to suppress the occurrence of bending of the beam portion due to the resonation of the beam portion.

The MEMS resonator according to the aspect of the invention may be configured such that the planar shape of the beam portion is symmetrical with respect to a first straight line along a direction from the supporting portion toward the tip.

According to this MEMS resonator, the beam portion can stably resonate.

The MEMS resonator according to the aspect of the invention may be configured such that the planar shape of the beam portion is an isosceles triangle.

According to this MEMS resonator, more stable resonation characteristics can be provided.

The MEMS resonator according to the aspect of the invention may be configured such that the beam portion has, in plan view, a first arc located on one side with respect to the first straight line and a second arc connected to the first arc and located on the other side opposite to the one side with respect to the first straight line, that the center of the first arc is located on a second straight line on the one side with respect to the first straight line, the second straight line being orthogonal to the first straight line and passing through an intersection point of the first arc and the second arc, and that the center of the second arc is located on the second straight line on the other side with respect to the first straight line.

According to this MEMS resonator, more stable resonation characteristics can be provided.

The MEMS resonator according to the aspect of the invention may be configured such that the planar shape of the beam portion is trapezoidal.

According to this MEMS resonator, compared to, for example, a MEMS resonator having a beam portion whose planar shape is triangular, the area of the beam portion can be increased when the length of the beam portion is made constant. Therefore, a large electrostatic force can be generated between the first electrode and the second electrode, making it possible to easily resonate the beam portion.

An oscillator according to another aspect of the invention includes the MEMS resonator according to the aspect of the invention.

According to the oscillator, stable resonation characteristics can be provided.

A method for manufacturing a MEMS resonator according to still another aspect of the invention includes: forming a first electrode above a substrate; forming a sacrificial layer so as to cover the first electrode; forming a second electrode having a supporting portion which is formed above the substrate and a beam portion which is supported by the supporting portion and arranged above the first electrode via the sacrificial layer; and removing the sacrificial layer, wherein in the forming of the second electrode, the beam portion is formed to have, in plan view, a shape in which the width monotonically decreases in a direction from the supporting portion toward a tip of the beam portion in a region overlapping the first electrode.

According to the method for manufacturing the MEMS resonator, it is possible to obtain a MEMS resonator having stable resonation characteristics.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a preferred embodiment of the invention will be described with reference to the drawings.

1. MEMS Resonator

Figure 1:
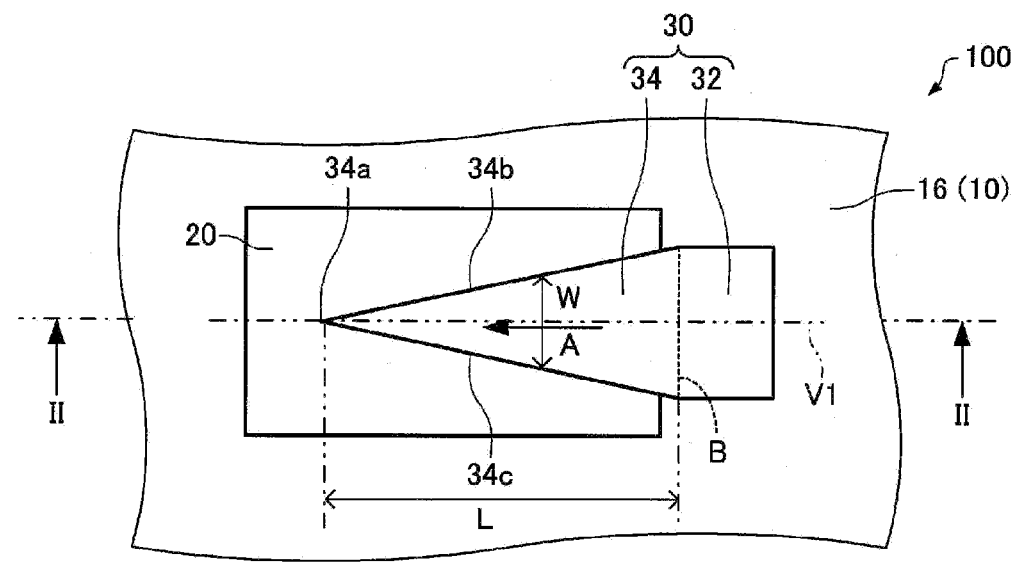
FIG. 1 is a plan view schematically showing a MEMS resonator according to an embodiment.
Figure 2:
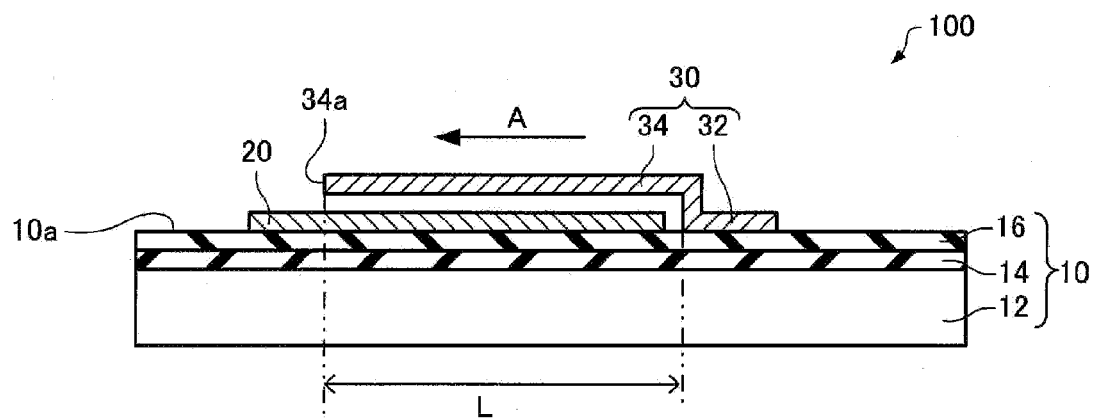
FIG. 2 is a cross-sectional view schematically showing the MEMS resonator according to the embodiment.

First, a MEMS resonator according to the embodiment will be described with reference to the drawings. FIG. 1 is a plan view schematically showing the MEMS resonator 100 according to the embodiment. FIG. 2 is a cross-sectional view schematically showing the MEMS resonator 100 according to the embodiment. FIG. 2 is the cross-sectional view taken along line II-II of FIG. 1.

As shown in FIGS. 1 and 2, the MEMS resonator 100 includes a substrate 10, a first electrode 20, and a second electrode 30.

The substrate 10 can have a supporting substrate 12, a first under layer 14, and a second under layer 16.

As the supporting substrate 12, for example, a semiconductor substrate, such as a silicon substrate, can be used. As the supporting substrate 12, various substrates, such as a ceramics substrate, a glass substrate, a sapphire substrate, a diamond substrate, and a synthetic resin substrate, may be used.

The first under layer 14 is formed above the supporting substrate 12 (more specifically, on the supporting substrate 12). As the first under layer 14, for example, a trench insulating layer, a LOCOS (local oxidation of silicon) insulating layer, or a semi-recessed LOCOS insulating layer can be used. The first under layer 14 can electrically isolate the MEMS resonator 100 from other elements (not shown) formed on the supporting substrate 12.

It is noted that, in the descriptions concerning the invention, the term 'above' may be used, for example, in a manner as "A is formed above B". In the case of such an example, it is meant that 'A' is formed at an upper location on the basis of 'B'. That is, 'A' may be located in a vertical direction (direction opposite to a direction in which gravity acts) with respect to 'B', or may be located in a direction different from the vertical direction with respect to 'B'.

The second under layer 16 is formed on the first under layer 14. Examples of the material of the second under layer 16 include, for example, silicon nitride. The second under layer 16 can function as an etching stopper layer in a release step which will be described later.

The first electrode 20 is formed on the substrate 10. The first electrode 20 has, for example, a layer-like shape or a thin film-like shape. The planar shape (shape viewed from a perpendicular direction of an upper surface 10a of the substrate 10) of the first electrode 20 is, for example, rectangular.

The second electrode 30 is formed spaced apart from the first electrode 20. The second electrode 30 has a supporting portion 32 formed on the substrate 10 and a beam portion 34 supported by the supporting portion 32 and arranged above the first electrode 20. The supporting portion 32 is arranged to face, for example, the first electrode 20. The second electrode 30 is formed in a cantilever fashion.

The beam portion 34 has, in plan view (viewed from the perpendicular direction of the upper surface 10a of the substrate 10), a shape in which a width W monotonically decreases in an A direction from the supporting portion 32 toward a tip 34a of the beam portion 34 in a region overlapping the first electrode 20. The planar shape of the beam portion 34 is, for example, triangular. As shown in FIG. 1, the tip 34a may be a vertex formed by sides 34b and 34c. The tip 34a is located, in plan view, inside the outer circumference of the first electrode 20. The planar shape of the beam portion 34 may be symmetrical with respect to a first straight line V1 along the A direction from the supporting portion 32 toward the tip 34a.

In the example shown in FIG. 1, the planar shape of the beam portion 34 is an isosceles triangle where the sides 34b and 34c are equal in length. Toward the A direction, the width W (length in a direction orthogonal to the A direction) of the beam portion 34 decreases. In the example shown in FIG. 1, it is also possible to define the width W of the beam portion 34 as, for example, a distance between the side 34b and the side 34c. Moreover, in the example shown in FIG. 1, it is also possible to define a length L of the beam portion 34 as, for example, a distance between the tip 34a and a boundary line B between the beam portion 34 and the supporting portion 32.

The width W of the beam portion 34 progressively changes from, for example, the supporting portion 32 toward the tip 34a. That is, it is possible to eliminate a section where the width remains the same on the way from the supporting portion 32 to the tip 34a, and the width W can be continuously changed from the supporting portion 32 toward the tip 34a. Although not shown in the drawing, as long as the width W monotonically decreases from the supporting portion 32 toward the tip 34a, the width W may change in a staircase pattern (in a stepwise fashion). That is, a region where the width W does not change may exist.

When a voltage is applied between the first electrode 20 and the second electrode 30, the beam portion 34 can resonate with an electrostatic force generated between the electrodes 20 and 30. The MEMS resonator 100 may have a covering structure which airtightly seals the first electrode 20 and the second electrode 30 in a reduced-pressure state. Thus, air resistance in resonation of the beam portion 34 can be reduced.

Examples of the material of the first electrode 20 and the second electrode 30 include, for example, polycrystalline silicon doped with a predetermined impurity to provide conductivity.

The MEMS resonator 100 according to the embodiment has the following features, for example.

According to the MEMS resonator 100, the beam portion 34 has the shape in which the width W monotonically decreases in the A direction from the supporting portion 32 toward the tip 34a in the region overlapping the first electrode 20. Thus, even when the length L of the beam portion 34 varies according to the variations in manufacturing process (more specifically, in patterning the second electrode 30), variations in the frequency of the beam portion 34 can be reduced (the details will be described later) compared to, for example, a beam portion having a rectangular planar shape. That is, it is possible to reduce the amount of change in frequency for the amount of change in the length L of the beam portion 34. As a result, the MEMS resonator 100 can have stable resonation characteristics. Generally, a frequency f of a resonator in a cantilever fashion can be expressed by the following equation (1), and the length L of a beam portion affects the frequency f with the square of the length. In the equation (1), E represents the Young's modulus of the beam portion; ρ the density of the beam portion; and t the thickness of the beam portion.

$$f = \frac{1}{2\pi}\sqrt{\frac{35E}{33\rho}}\frac{t}{L^2} \tag{1}$$

According to the MEMS resonator 100, the beam portion 34 can have the shape in which the width W progressively changes from the supporting portion 32 toward the tip 34a. That is, it is possible to eliminate a section where the width remains the same on the way from the supporting portion 32 to the tip 34a, and the width W can be continuously changed from the supporting portion 32 toward the tip 34a. Therefore, it is possible to suppress the occurrence of bending of the beam portion due to the resonation of the beam portion.

According to the MEMS resonator 100, the beam portion 34 can be symmetrical with respect to the first straight line V1 along the A direction from the supporting portion 32 toward the tip 34a. Thus, the beam portion 34 can resonate stably.

2. Method for Manufacturing MEMS Resonator

Figure 3:
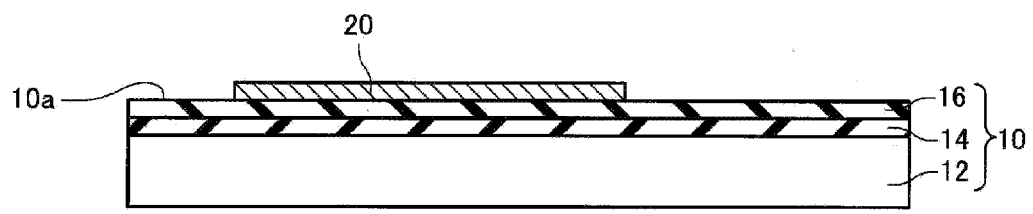
FIG. 3 is a cross-sectional view schematically showing a manufacturing step of the MEMS resonator according to the embodiment.
Figure 4:
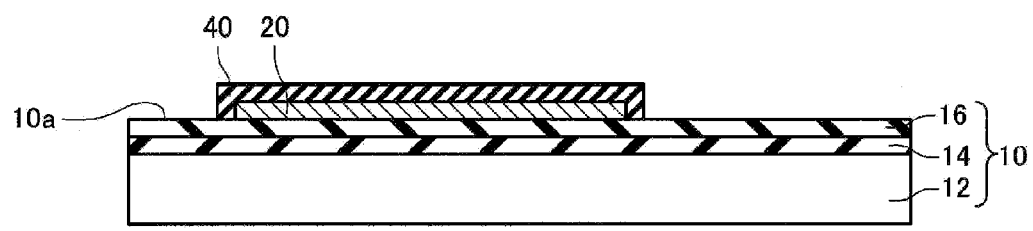
FIG. 4 is a cross-sectional view schematically showing a manufacturing step of the MEMS resonator according to the embodiment.
Figure 5:
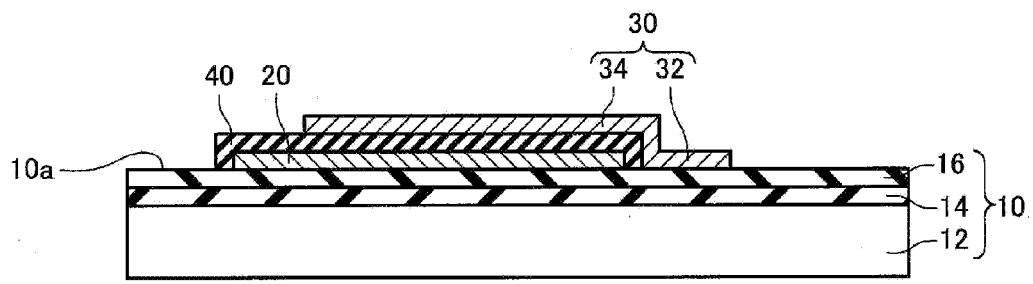
FIG. 5 is a cross-sectional view schematically showing a manufacturing step of the MEMS resonator according to the embodiment.

Next, a method for manufacturing the MEMS resonator according to the embodiment will be described with reference to the drawings. FIGS. 3 to 5 are cross-sectional views schematically showing manufacturing steps of the MEMS resonator 100 according to the embodiment.

As shown in FIG. 3, the first under layer 14 and the second under layer 16 are formed in this order on the supporting substrate 12 to obtain the substrate 10. The first under layer 14 is formed by, for example, an STI (shallow trench isolation) method or a LOCOS method. The second under layer 16 is formed by, for example, a CVD (chemical vapor deposition) method or a sputtering method.

Next, the first electrode 20 is formed on the substrate 10. More specifically, the first electrode 20 is formed by deposition by a CVD method, a sputtering method, or the like and then by patterning using a photolithographic technique and an etching technique. When the first electrode 20 is made of polycrystalline silicon, polycrystalline silicon is doped with a predetermined impurity to provide conductivity.

As shown in FIG. 4, a sacrificial layer 40 is formed so as to cover the first electrode 20. The sacrificial layer 40 is formed by, for example, thermally oxidizing the first electrode 20. Examples of the material of the sacrificial layer 40 include, for example, silicon oxide.

As shown in FIG. 5, the second electrode 30 is formed on the sacrificial layer 40 and the substrate 10. More specifically, the second electrode 30 is formed by deposition by a CVD method, a sputtering method, or the like and then by patterning using a photolithographic technique and an etching technique. When the second electrode 30 is made of polycrystalline silicon, polycrystalline silicon is doped with a predetermined impurity to provide conductivity.

As shown in FIG. 1, the sacrificial layer 40 is removed (release step). The removal of the sacrificial layer 40 is performed by, for example, wet etching using hydrofluoric acid, buffered hydrofluoric acid (a mixture of hydrofluoric acid and ammonium fluoride), or the like. In the release step, the second under layer 16 can function as an etching stopper layer.

Through the steps described above, the MEMS resonator 100 can be manufactured.

According to the method for manufacturing the MEMS resonator 100 as described above, it is possible to obtain the MEMS resonator 100 having stable resonation characteristics.

3. Modified Examples of MEMS Resonator

Next, MEMS resonators according to modified examples of the embodiment will be described with reference to the drawings. Hereinafter, in the MEMS resonators according to the modified examples of the embodiment, members having functions similar to those of the constituent members of the MEMS resonator 100 according to the embodiment are denoted by the same reference numerals and signs, and the detailed description thereof is omitted.

3.1. MEMS Resonator According to First Modified Example

Figure 6:
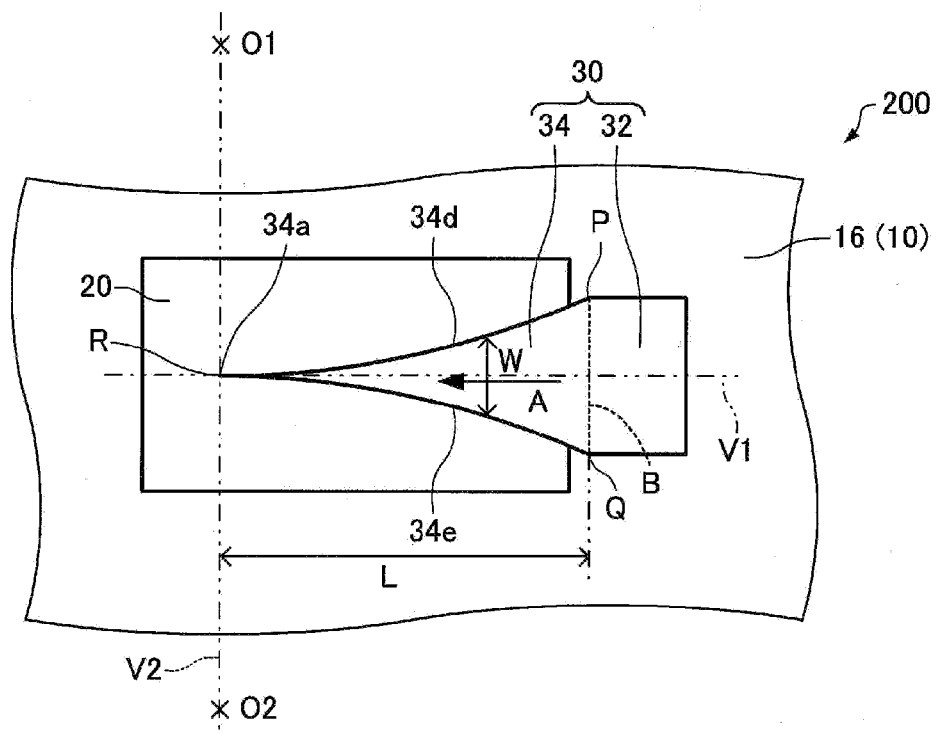
FIG. 6 is a plan view schematically showing a MEMS resonator according to a first modified example of the embodiment.

FIG. 6 is a plan view schematically showing a MEMS resonator 200 according to a first modified example of the embodiment, corresponding to FIG. 1.

In the example of the MEMS resonator 100 as shown in FIG. 1, the planar shape of the beam portion 34 is an isosceles triangle where the sides 34b and 34c are equal in length.

On the other hand, the MEMS resonator 200 has, in plan view as shown in FIG. 6, a first arc 34d and a second arc 34e. The first arc 34d and the second arc 34e are arranged symmetrically with respect to the first straight line V1. The first arc 34d and the second arc 34e are connected at an intersection point R. The intersection point R can form the tip 34a of the beam portion 34. In the example shown in the drawing, the planar shape of the beam portion 34 of the MEMS resonator 200 is composed of the boundary line B between the supporting portion 32 and the beam portion 34, the first arc 34d connected to the boundary line B, and the second arc 34e connected to the boundary line B and the first arc 34d.

The first arc 34d is located on one side of the first straight line V1. The center O1 of the first arc 34d is located on a second straight line V2 on the one side of the first straight line V1. That is, a distance from the center O1 to the intersection point R is equal to a distance from the center O1 to an intersection point P of the first arc 34d and the boundary line B. The second straight line V2 is a straight line which is orthogonal to the first straight line V1 and passes through the intersection point R.

The second arc 34*e* is located on the other side of the first straight line V1. The center O2 of the second arc 34*e* is located on the second straight line V2 on the other side of the first straight line V1. That is, a distance from the center O2 to the intersection point R is equal to a distance from the center O2 to an intersection point Q of the second arc 34*e* and the boundary line B.

According to the MEMS resonator 200, it is possible to further reduce the amount of change in frequency for the amount of change in the length L of the beam portion 34 (the details will be described later) compared to the MEMS resonator 100. As a result, the MEMS resonator 200 can have more stable resonation characteristics.

3.2. MEMS Resonator According to Second Modified Example

Figure 7:
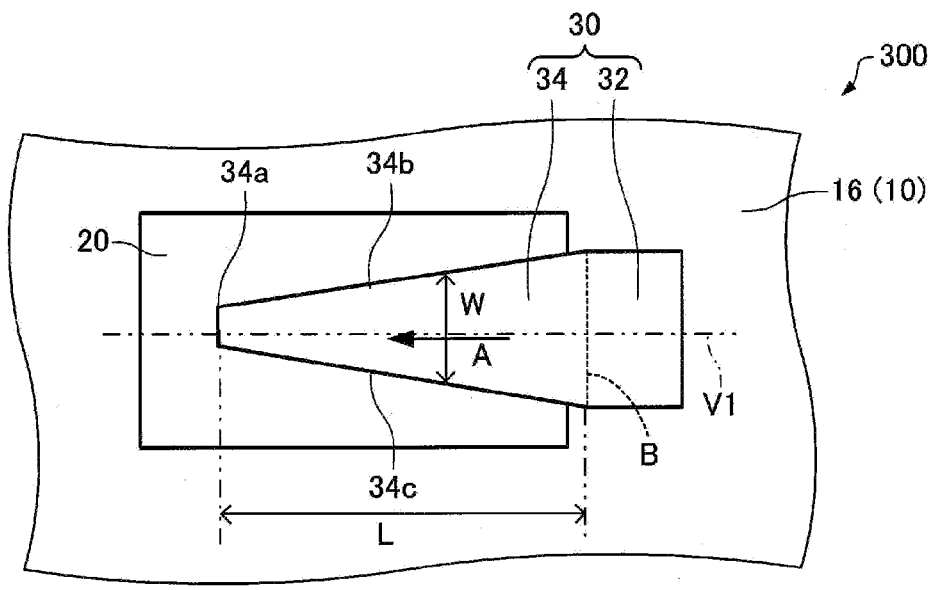
FIG. 7 is a plan view schematically showing a MEMS resonator according to a second modified example of the embodiment.

FIG. 7 is a plan view schematically showing a MEMS resonator 300 according to a second modified example of the embodiment, corresponding to FIG. 1.

The planar shape of the MEMS resonator 300 is trapezoidal as shown in FIG. 7. In the MEMS resonator 300, the tip 34*a* is a side which connects the side 34*b* with the side 34*c*.

According to the MEMS resonator 300, compared to the MEMS resonator 100 for example, the area of the beam portion 34 can be increased when the length of the beam portion 34 is made constant. Therefore, a large electrostatic force can be generated between the electrodes 20 and 30, making it possible to easily resonate the beam portion 34.

4. Oscillator

Figure 8:
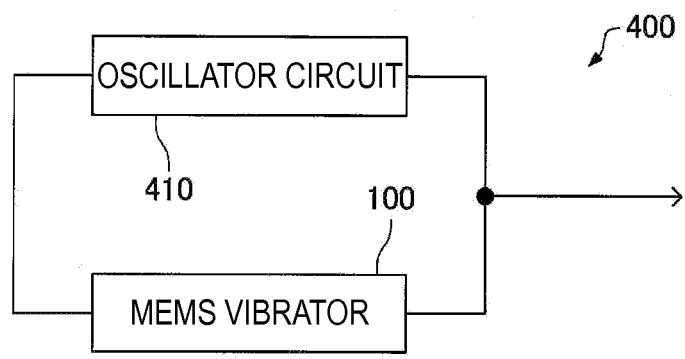
FIG. 8 schematically shows an oscillator according to the embodiment.

Next, an oscillator according to the embodiment will be described with reference to the drawing. FIG. 8 schematically shows the oscillator 400 according to the embodiment.

As shown in FIG. 8, the oscillator 400 includes any of the MEMS resonators (for example, the MEMS resonator 100) according to the invention and an oscillator circuit 410.

The oscillator circuit 410 is electrically connected to the MEMS resonator 100. When a voltage is applied between the electrodes 20 and 30 of the MEMS resonator 100 from the oscillator circuit 410, the beam portion 34 can resonate with an electrostatic force generated between the electrodes 20 and 30. With the oscillator circuit 410, the MEMS resonator 100 can oscillate at a resonant frequency.

Transistors, capacitors (none of them shown), and the like of which the oscillator circuit 410 is composed may be formed on, for example, the supporting substrate 12. Thus, the MEMS resonator 100 and the oscillator circuit 410 can be formed monolithically.

When the MEMS resonator 100 and the oscillator circuit 410 are formed monolithically, members such as transistors of which the oscillator circuit 410 is composed may be formed in the same step as that of forming the MEMS resonator 100 described above. Specifically, in the step of forming the sacrificial layer 40 (refer to FIG. 4), a gate insulating layer of the transistors may be formed. Further, in the step of forming the second electrode 30 (refer to FIG. 5), gate electrodes of the transistors may be formed. In this manner, the manufacturing steps are commonly used in the MEMS resonator 100 and the oscillator circuit 410, whereby the manufacturing steps can be simplified.

According to the oscillator 400, since the MEMS resonator according to the invention is included, stable resonation characteristics can be provided.

5. Experimental Examples

Next, experimental examples of the MEMS resonators according to the embodiment will be described with reference to the drawings. Specifically, simulations in which the MEMS resonators according to the embodiment are modeled will be described. The simulations were performed using I-DEAS (manufactured by Siemens PLM Software).

5.1. Configuration of Model

Figure 9A:
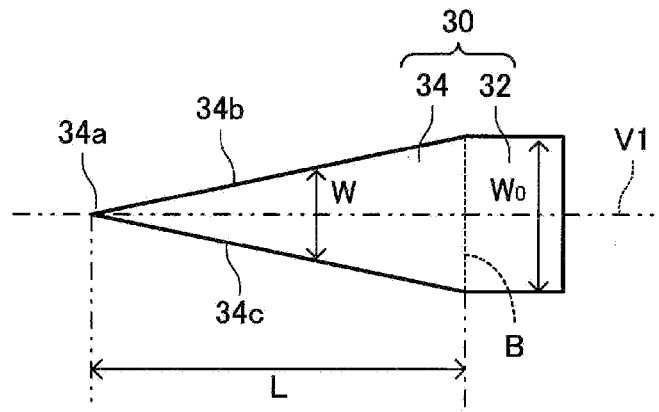
FIGS. 9A to 9C are plan views schematically showing models used in experimental examples.

FIG. 9A is a plan view schematically showing a model used in a simulation as Example 1. Example 1 corresponds to the second electrode 30 of the MEMS resonator 100 (refer to FIG. 1). In FIG. 9A, portions corresponding to those of the second electrode 30 of the MEMS resonator 100 are denoted by the same reference numerals and signs in Example 1.

The beam portion 34 of Example 1 is symmetrical with respect to the first straight line V1 as shown in FIG. 9A and is an isosceles triangle where the side 34*b* and the side 34*c* are equal in length. The length L of the beam portion 34 is a distance between the tip 34*a* (vertex formed by the sides 34*b* and 34*c*) and the boundary line B between the beam portion 34 and the supporting portion 32.

Figure 9B:
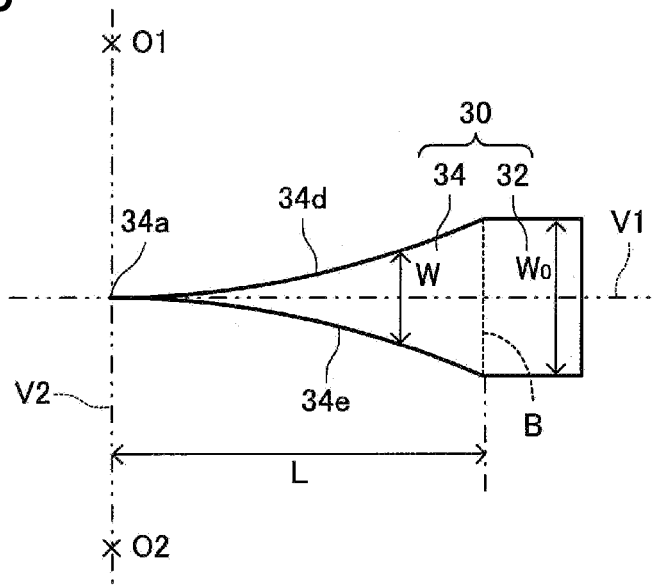

FIG. 9B is a plan view schematically showing a model used in a simulation as Example 2. Example 2 corresponds to the second electrode 30 of the MEMS resonator 200 (refer to FIG. 6). In FIG. 9B, portions corresponding to those of the second electrode 30 of the MEMS resonator 200 are denoted by the same reference numerals and signs in Example 2.

The beam portion 34 of Example 2 is symmetrical with respect to the first straight line V1 as shown in FIG. 9B and has the first arc 34*d* located on one side with respect to the first straight line V1 and the second arc 34*e* located on the other side opposite to the one side with respect to the first straight line V1. The center O1 of the arc 34*d* is located on the second straight line V2 on the one side with respect to the first straight line V1. The center O2 of the arc 34*e* is located on the second straight line V2 on the other side with respect to the first straight line V1. The length L of the beam portion 34 is a distance between the tip 34*a* (intersection point formed by the arcs 34*d* and 34*e*) and the boundary line B between the beam portion 34 and the supporting portion 32.

Figure 9C:
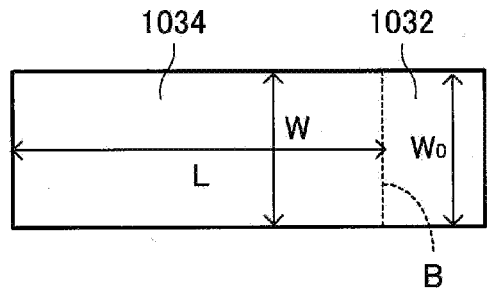

FIG. 9C is a plan view schematically showing a model used in a simulation as Comparative Example 1.

A beam portion 1034 of Comparative Example 1 is rectangular as shown in FIG. 9C. The length L of the beam portion 1034 is a distance between a tip of the beam portion 1034 and the boundary line B between the beam portion 1034 and a supporting portion 1032.

In Examples 1 and 2 and Comparative Example 1 described above, the frequency f at the time of resonation while changing the length L was measured. In Examples 1 and 2 and Comparative Example 1, a width $W_0$ (length of the boundary line B) of the supporting portion is 4 µm; the thickness 270 nm; the Young's modulus 123 GPa; the Poisson ratio 0.22; and the density 2230 kg/cm$^3$.

5.2. Simulation Results

Figure 10:
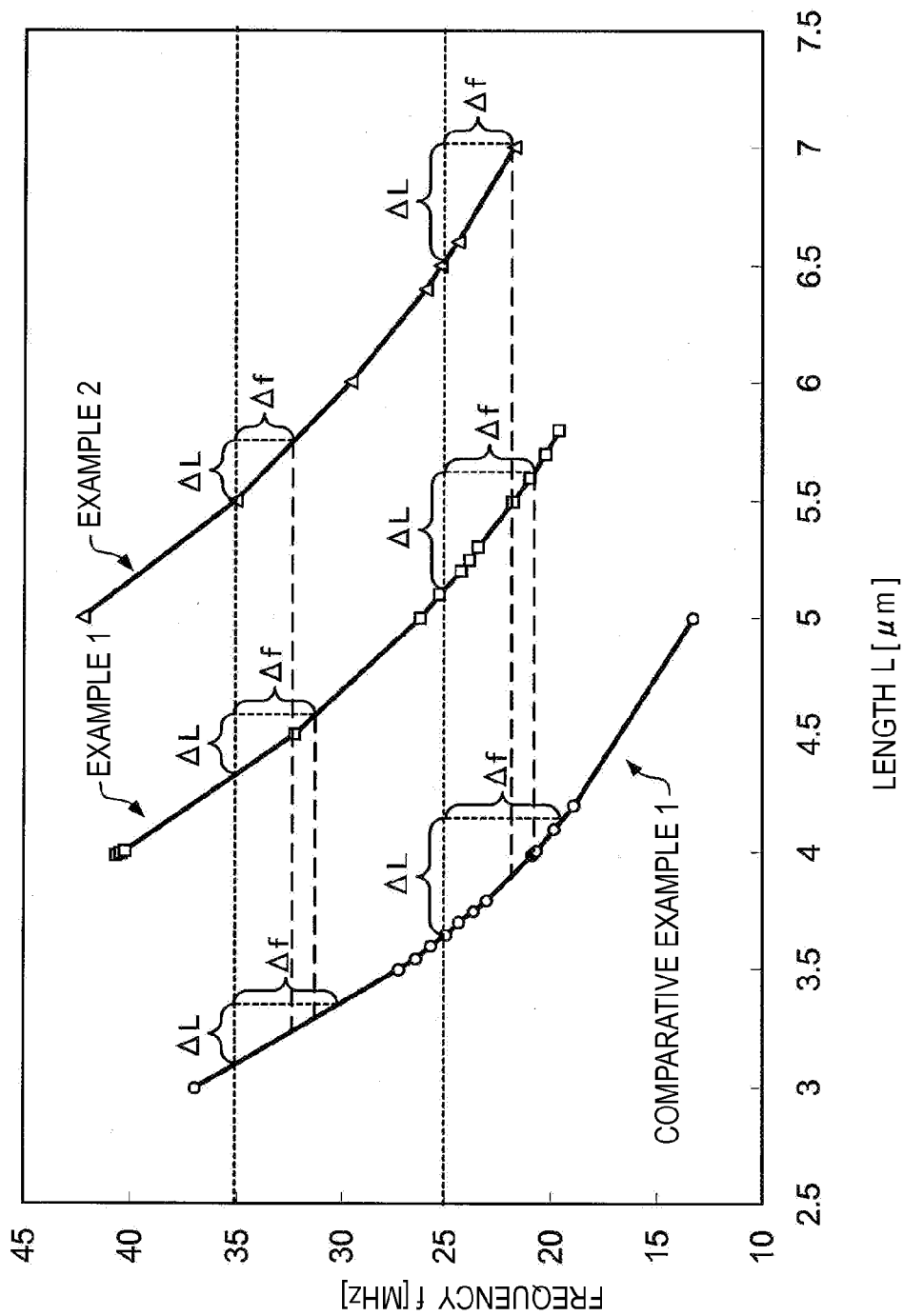
FIG. 10 is a graph showing the results of the experimental examples.

FIG. 10 is a graph showing simulation results. It is found from FIG. 10 that the amount of change in the frequency f for the amount of change in the length L is small in Example 1 compared to Comparative Example 1. Similarly, it is found that the amount of change in the frequency f for the amount of change in the length L is small in Example 2 compared to Comparative Example 1 and Example 1.

That is, it is assumed that the length L of Examples 1 and 2 and Comparative Example 1 is so designed that the frequency f=25 MHz can be obtained (refer to FIG. 10). It is found that when the length L is shifted by ΔL (for example, 0.5 µm), an amount of change Δf in frequency is smaller in Example 1 than in Comparative Example 1 and the amount of change Δf in frequency is smaller in Example 2 than in Example 1. Accordingly, it is found that even when the length L varies according to, for example, variations in manufacturing process, variations in the frequency f can be reduced in Examples 1 and 2 compared to Comparative Example 1.

The results described above are similar also in the case of the frequency f=35 MHz as shown in FIG. 10 and are applicable irrespective of the value of frequency. In the example of the frequency f=35 MHz in FIG. 10, ΔL is 0.25 μm.

The embodiment and modified examples described above are illustrative only, and the invention is not limited to them. For example, it is also possible to appropriately combine the embodiment and the modified examples.

While the embodiment of the invention has been described above in detail, those skilled in the art should readily understand that many modifications can be made without departing in substance from the novel matter and effects of the invention. Accordingly, all of those modified examples are deemed to be included in the scope of the invention.

The entire disclosure of Japanese Patent Application No. 2010-276923, filed Dec. 13, 2010 is expressly incorporated by reference herein.

What is claimed is:

1. A MEMS resonator comprising:
   a substrate;
   a first electrode formed above the substrate; and
   a second electrode having a supporting portion which is formed above the substrate and a beam portion which is supported by the supporting portion and arranged above the first electrode, wherein
   the beam portion has, in plan view, a shape in which the width monotonically decreases in a direction from the supporting portion toward a tip of the beam portion in a region overlapping the first electrode.

2. The MEMS resonator according to claim 1, wherein
   the beam portion has a shape in which the width progressively changes from the supporting portion toward the tip of the beam portion.

3. The MEMS resonator according to claim 1, wherein
   the planar shape of the beam portion is symmetrical with respect to a first straight line along a direction from the supporting portion toward the tip.

4. The MEMS resonator according to claim 3, wherein
   the planar shape of the beam portion is an isosceles triangle.

5. The MEMS resonator according to claim 3, wherein
   the beam portion has, in plan view, a first arc located on one side with respect to the first straight line and a second arc connected to the first arc and located on the other side opposite to the one side with respect to the first straight line,
   the center of the first arc is located on a second straight line on the one side with respect to the first straight line, the second straight line being orthogonal to the first straight line and passing through an intersection point of the first arc and the second arc, and
   the center of the second arc is located on the second straight line on the other side with respect to the first straight line.

6. The MEMS resonator according to claim 3, wherein
   the planar shape of the beam portion is trapezoidal.

7. An oscillator comprising the MEMS resonator according to claim 1.

8. A method for manufacturing a MEMS resonator, comprising:
   forming a first electrode above a substrate;
   forming a sacrificial layer so as to cover the first electrode;
   forming a second electrode having a supporting portion which is formed above the substrate and a beam portion which is supported by the supporting portion and arranged above the first electrode via the sacrificial layer; and
   removing the sacrificial layer, wherein
   in the forming of the second electrode, the beam portion is formed to have, in plan view, a shape in which the width monotonically decreases in a direction from the supporting portion toward a tip of the beam portion in a region overlapping the first electrode.

* * * * *